United States Patent
Lee et al.

(10) Patent No.: US 8,029,859 B2
(45) Date of Patent: Oct. 4, 2011

(54) METHOD OF DEPOSITING GE-SB-TE THIN FILM

(75) Inventors: Jung-Wook Lee, Pyungtaek-si (KR);
Byung-Chul Cho, Pyungtaek-si (KR);
Ki-Hoon Lee, Pyungtaek-si (KR);
Tae-Wook Seo, Pyungtaek-si (KR)

(73) Assignee: Integrated Process Systems Ltd., Kyungki-do (KR)

( * ) Notice: Subject to any disclaimer, the term of this patent is extended or adjusted under 35 U.S.C. 154(b) by 820 days.

(21) Appl. No.: 11/507,829

(22) Filed: Aug. 22, 2006

(65) Prior Publication Data

US 2007/0048977 A1    Mar. 1, 2007

(30) Foreign Application Priority Data

Aug. 24, 2005  (KR) .................. 10-2005-0078009
Aug. 24, 2005  (KR) .................. 10-2005-0078010

(51) Int. Cl.
*C23C 16/00*  (2006.01)
*H05H 1/24*  (2006.01)
*C23C 16/06*  (2006.01)

(52) U.S. Cl. ............ 427/248.1; 427/569; 427/255.23; 427/255.35; 427/255.29

(58) Field of Classification Search .......... 427/248.1, 427/569, 255.23, 255.35, 255.29
See application file for complete search history.

(56) References Cited

U.S. PATENT DOCUMENTS

| | | | |
|---|---|---|---|
| 5,178,904 A | 1/1993 | Ishihara et al. | |
| 5,320,736 A | 6/1994 | Stickney et al. | |
| 5,359,205 A | 10/1994 | Ovshinsky | |
| 7,300,873 B2 * | 11/2007 | Millward | 438/681 |
| 7,371,429 B2 * | 5/2008 | Lee et al. | 427/255.28 |
| 2001/0002280 A1 | 5/2001 | Sneh | |
| 2005/0009325 A1 * | 1/2005 | Chung et al. | 438/637 |
| 2006/0049447 A1 * | 3/2006 | Lee et al. | 257/314 |
| 2006/0172067 A1 * | 8/2006 | Ovshinsky et al. | 427/248.1 |
| 2006/0172068 A1 * | 8/2006 | Ovshinsky | 427/248.1 |

FOREIGN PATENT DOCUMENTS

| | | |
|---|---|---|
| JP | 62-142776 A | 6/1987 |
| JP | 2000-269140 A | 9/2000 |
| JP | 2002-117574 A | 4/2002 |
| JP | 2003-517731 A | 5/2003 |
| JP | 10-2006-0091160 | 8/2006 |
| KR | 10-2006-0074236 | 7/2006 |
| KR | 10-2006-0091160 | 8/2006 |

* cited by examiner

*Primary Examiner* — Kelly M Gambetta
(74) *Attorney, Agent, or Firm* — Ladas & Parry LLP

(57) ABSTRACT

There is provided a method of depositing a Ge—Sb—Te thin film, including: a Ge—Sb—Te thin-film forming step of feeding and purging a first precursor including any one of Ge, Sb and Te, a second precursor including another one of Ge, Sb and Te and a third precursor including the other one of Ge, Sb and Te into and from a chamber in which a wafer is mounted and forming the Ge—Sb—Te thin film on the wafer; and a reaction gas feeding step of feeding reaction gas while any one of the first to third precursors is fed.

16 Claims, 18 Drawing Sheets

METHOD OF DEPOSITING GE-SB-TE THIN FILM

BACKGROUND OF THE INVENTION

1. Field of the Invention

The present invention relates to a method of manufacturing a phase-change random access memory (PRAM) for storing data by changing a phase, and more particularly, a method of depositing chalcogenide which is a phase-change material.

2. Description of the Related Art

A PRAM uses a phase-change material of which the electrical resistance varies depending on an amorphous/crystalline state and the phase-change material may be chalcogenide (GST or Ge—Sb—Te; hereinafter, referred to as Ge—Sb—Te) including germanium (Ge), antimony (Sb) and tellurium (Te). Such a phase-change material is changed to the amorphous state or the crystalline state by heating or cooling. The resistance of the phase-change material is high in the amorphous state, but is low in the crystalline state. The values 0 and 1 of data can be identified by the change of the resistance. In order to grow a material Ge—Sb—Te which is the phase-change material, a sputtering method using the material Ge—Sb—Te as a target is generally used.

However, when a Ge—Sb—Te thin film is formed by the sputtering method, the composition of Ge, Sb and Te is very hard to be adjusted and a step-coverage is poor.

SUMMARY OF THE INVENTION

Accordingly, an object of the present invention is to provide a method of depositing a Ge—Sb—Te thin film which can easily adjust the composition of Ge, Sb and Te and has an excellent step-coverage.

In order to accomplish the above-described object, there is provided a method of depositing a Ge—Sb—Te thin film, including: a Ge—Sb—Te thin-film forming step of feeding and purging a first precursor including any one of Ge, Sb and Te, a second precursor including another one of Ge, Sb and Te and a third precursor including the other one of Ge, Sb and Te into and from a chamber in which a wafer is mounted and forming the Ge—Sb—Te thin film on the wafer; and a reaction gas feeding step of feeding reaction gas while any one of the first to third precursors is fed. The method may further include a step of adjusting the thickness of the film formed by repeating the Ge—Sb—Te thin-film forming step.

The reaction gas may be fed while any one of the first to third precursors is purged. Plasma may be applied into the chamber while the reaction gas is fed.

When the plasma is applied, the Ge—Sb—Te thin-film forming step is performed by sequentially performing a feeding step of feeding the first precursor, a purging step of purging the first precursor, a feeding step of feeding the second precursor, a purging step of purging the second precursor, a feeding step of feeding the third precursor, a purging step of purging the third precursor, a feeding step of feeding the second precursor again, and a purging step of purging the second precursor again, the first precursor includes Ge, the second precursor includes Te, and the third precursor includes Sb.

In the present invention, the Ge—Sb—Te thin-film forming step may be performed by sequentially performing a feeding step of feeding the first precursor, a purging step of purging the first precursor, a feeding step of feeding the second precursor, a purging step of purging the second precursor, a feeding step of feeding the third precursor and a purging step of purging the third precursor.

The Ge—Sb—Te thin-film forming step may be performed by sequentially performing a feeding step of simultaneously feeding the first precursor and the second precursor, a purging step of simultaneously purging the first precursor and the second precursor, a feeding step of simultaneously feeding the second precursor and the third precursor and a purging step of simultaneously purging the second precursor and the third precursor.

Alternatively, the Ge—Sb—Te thin-film forming step may be performed by sequentially performing a feeding step of simultaneously feeding the first to third precursors and a purging step of simultaneously purging the first to third precursors.

In the above-described Ge—Sb—Te thin-film forming steps, the composition of the elements of the Ge—Sb—Te thin film can be adjusted by adjusting the vapor pressures and the temperatures of the first to third precursors or adjusting times for feeding the first to third precursors or the amount of carrier gas in a state where the vapor pressures and the temperatures are fixed.

In the present invention, the reaction gas may be at least one selected from the group consisting of $H_2$ and $NH_3$ or a mixture of the at least one selected from the group consisting of $H_2$ and $NH_3$ and inert gas. More particularly, when the plasma is used, the reaction gas may be at least one selected from the group consisting of $H_2$, $NH_3$ and He or a mixture of the at least one selected from the group consisting of $H_2$, $NH_3$ and He and inert gas. The temperature of the wafer may be in a range of 20° C. to 700° C. The pressure of the chamber may be in a range of 0.1 Torr to 100 Torr.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Thermal Method

Figure 1:
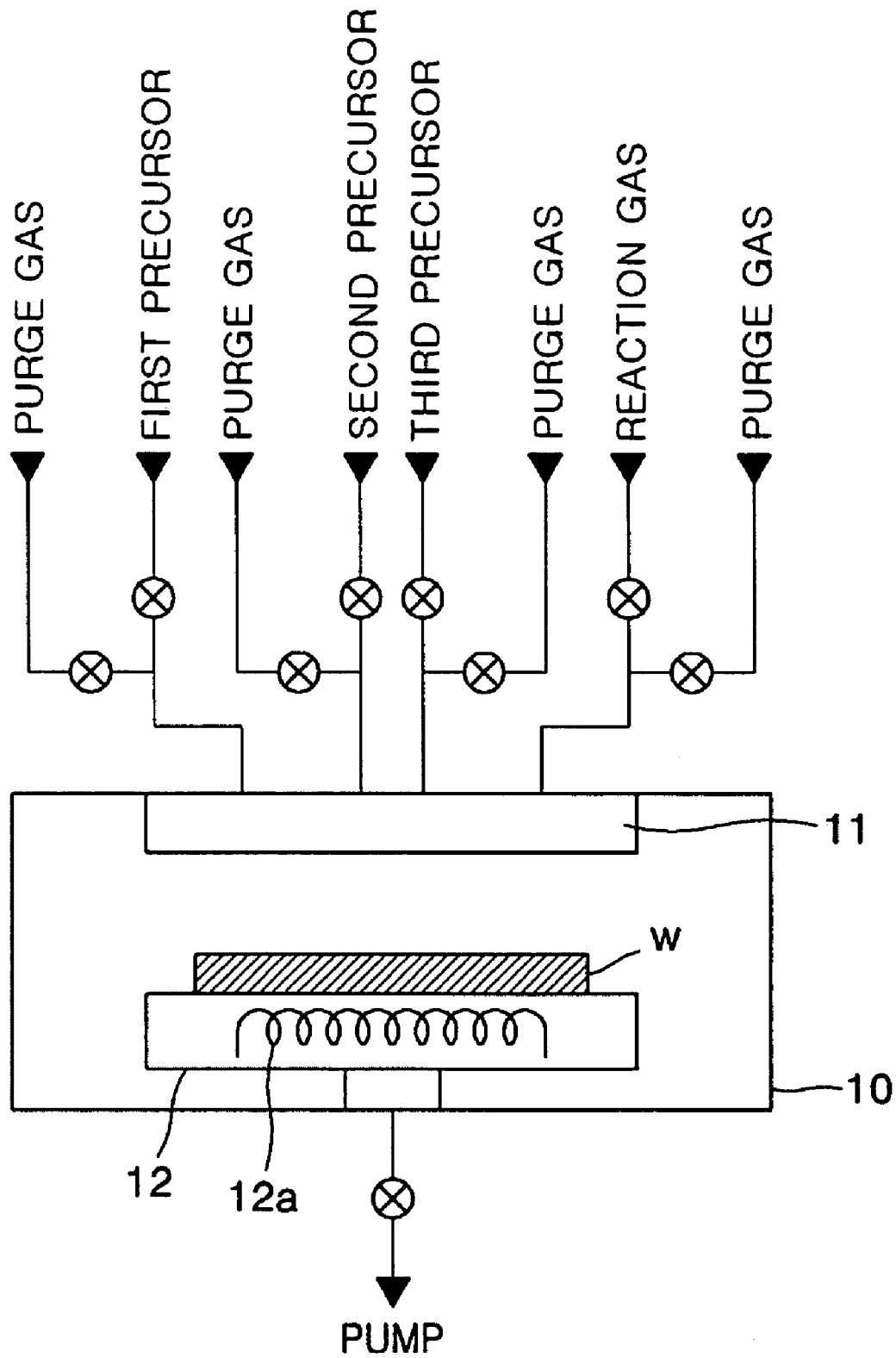
FIG. 1 is a view showing the configuration of a thin-film depositing apparatus which can perform methods of depositing a Ge—Sb—Te thin film according to first to sixth embodiments of the present invention.
Figure 2:
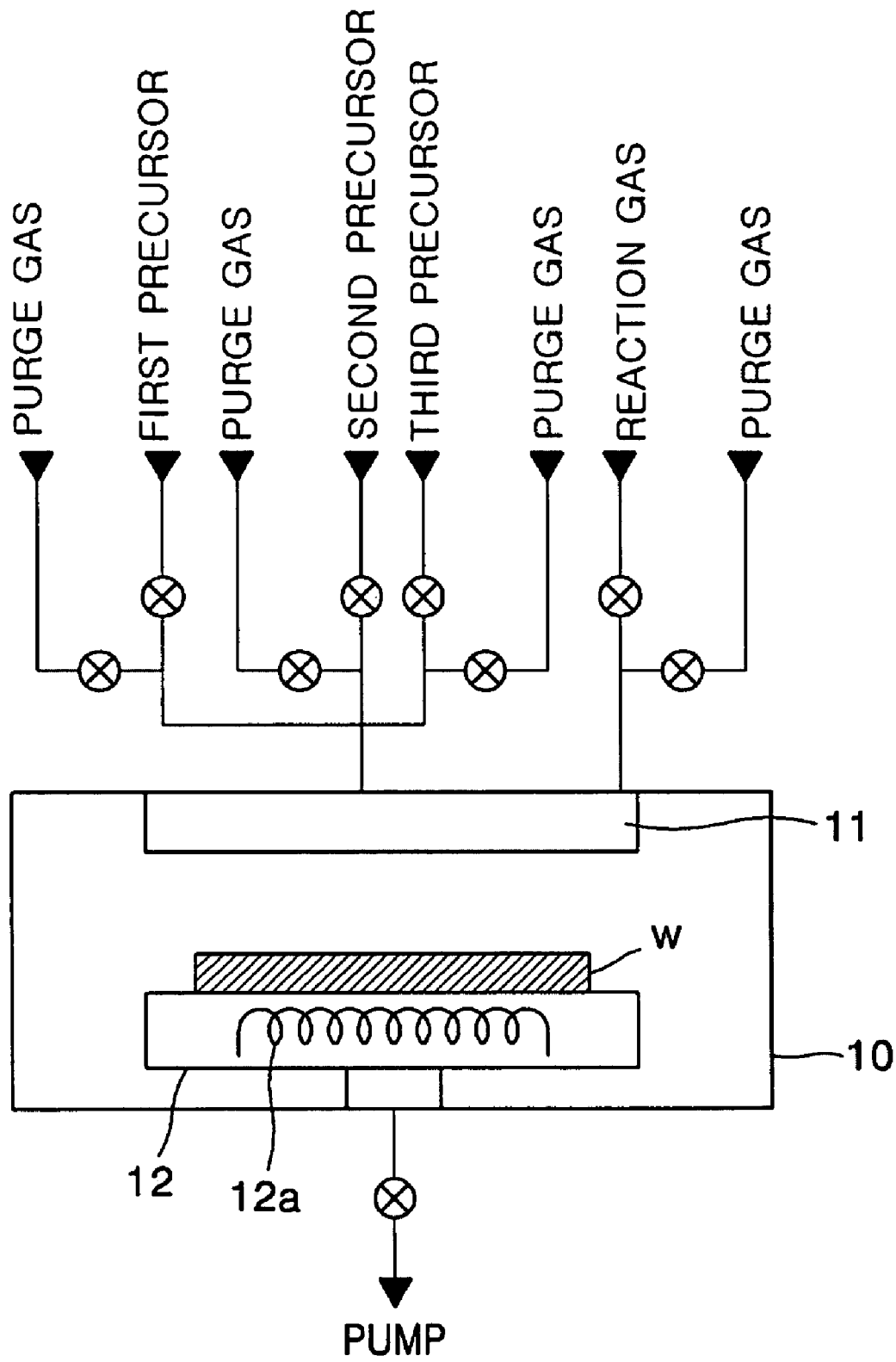
FIG. 2 is a view showing the configuration of another thin-film depositing apparatus which can perform methods of depositing a Ge—Sb—Te thin film according to the first to sixth embodiments of the present invention.

FIG. 1 is a view showing the configuration of a thin-film depositing apparatus which can perform methods of depositing a Ge—Sb—Te thin film according to first to sixth embodiments of the present invention, and FIG. 2 is a view showing the configuration of another thin-film depositing apparatus which can perform methods of depositing a Ge—Sb—Te thin film according to the first to sixth embodiments of the present invention.

In the method of depositing the Ge—Sb—Te thin film according to the present invention, a wafer w is mounted on a wafer block 12 in a chamber 10, and a first precursor including any one of Ge, Sb and Te, a second precursor including another one of Ge, Sb and Te and a third precursor including the other one of Ge, Sb and Te are fed into and purged from the chamber 10, thereby depositing the Ge—Sb—Te thin film on the wafer w. While at least one of the first to third precursors is fed, reaction gas is fed into the chamber 10.

In the embodiments of the present invention, $Ge(C_4H_9)_3H$ (Triisobutyl Germanium hydride) is used as the precursor including Ge, $Sb(C_3H_7)_3$ (Triisopropyl Antimony) is used as the precursor including Sb and $Te(C_4H_9)$(Diisopropyl Tellurium) is used as the precursor including Te. As inert gas for purging the first to third precursors from the chamber 10, $N_2$, Ar, He may be used.

The chamber 10 for depositing the Ge—Sb—Te thin film includes a shower head 11 which is provided therein to jet the first to third precursors and the inert gas and the wafer block 12 which is provided below the shower head 11 so as to mount the wafer w thereon. At this time, the chamber 10 may have three gas lines connected to the shower head 11 such that the first to third precursors are separately introduced as shown in FIG. 1 or one gas line through which all the first to third precursors are introduced as shown in FIG. 2. Although not shown, the chamber 10 may further include a pumping baffle which is provided on the outer circumference of the wafer block 12 to smoothly and uniformly pump the precursors, the inert gas and a reaction by-product or a tool for jetting the inert gas to the outer circumference of the shower head 11 to form an inert gas curtain.

The method of depositing the Ge—Sb—Te thin film is performed in a state where the temperature of the chamber 10 is in a range of 200° C. to 700° C. and the pressure thereof is in a range of 0.1 Torr to 100 Torr. At this time, the wafer block 12 is heated by a heater 12a mounted therein in a range of 20° C. to 700° C.

Hereinafter, the method of depositing Ge—Sb—Te thin film according to the present invention will be described using the thin-film depositing apparatus shown in FIGS. 1 and 2 in detail.

First Embodiment

Figure 3:
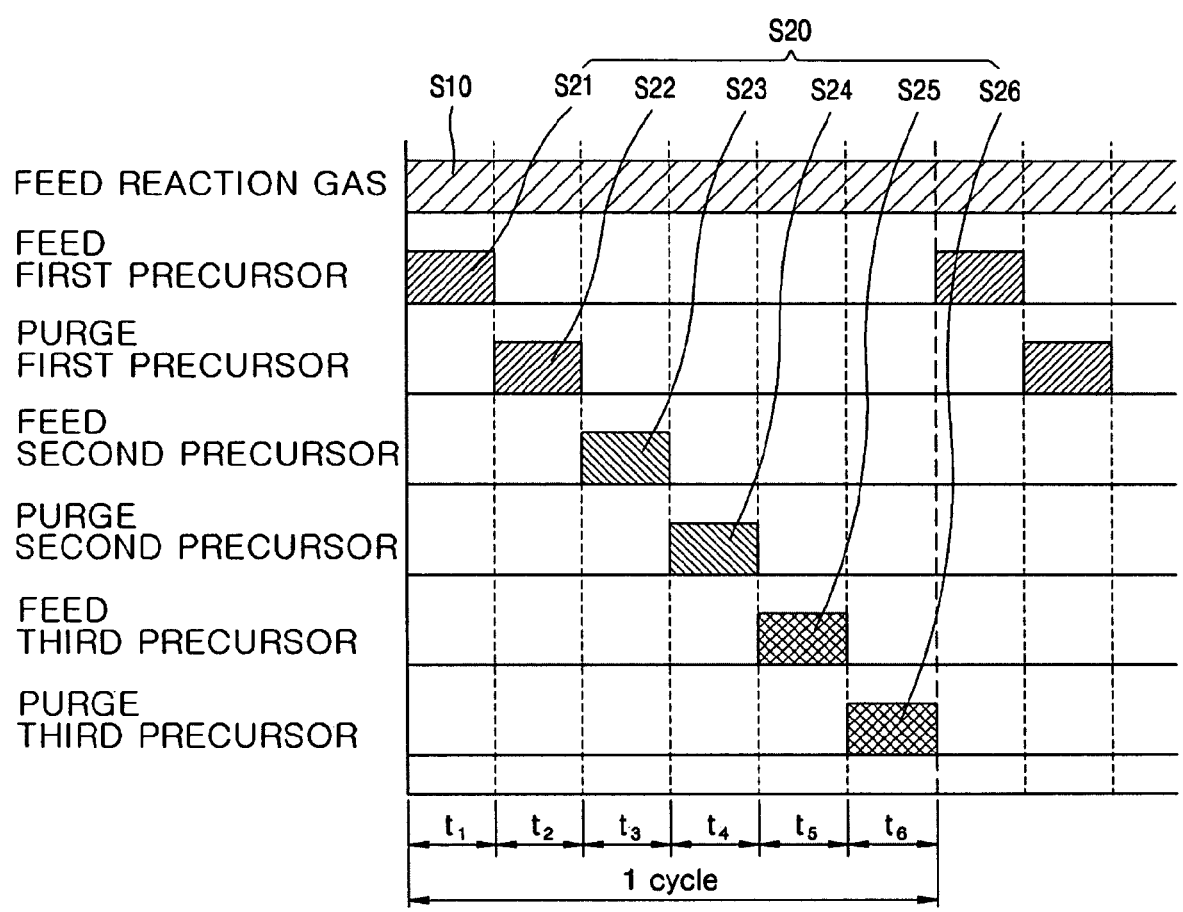
FIG. 3 is a view showing the flow of a method of depositing a Ge—Sb—Te thin film according to a first embodiment of the present invention.

First, FIG. 3 is a view showing the flow of a method of depositing a Ge—Sb—Te thin film according to a first embodiment of the present invention.

Referring to FIG. 3, the method of depositing the Ge—Sb—Te thin film according to the first embodiment of the present invention includes a Ge—Sb—Te thin-film forming step S20 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S10 of feeding the reaction gas into the chamber 10 while the first to third precursors are fed and purged, and a step of adjusting the thickness of the film formed by repeating the Ge—Sb—Te thin-film forming step S20.

First, in the reaction gas feeding step S10, at least one selected from the group consisting of $H_2$ and $NH_3$ is fed as the reaction gas. Only the reaction gas may be fed or a mixture of the inert gas and the reaction gas may be fed. The reaction gas reacts with the first to third precursors introduced into the chamber 10 to deposit the Ge—Sb—Te thin film on the wafer w in the chamber 10.

At this time, when $H_2$ is used as the reaction gas, $H_2$ is thermally decomposed and H+ ions react with the precursors. When $NH_3$ is used as the reaction gas, $NH_3$ is decomposed ($NH_3 \rightarrow NH_2- +H+$) and reacts with the precursors. At this time, $NH_3$ may be used together with $H_2$ and Ar or Ar. $NH_3$ serves to remove impurities C (carbon) contained in the precursor and to improve an electrical property such as a low operation voltage when an actual device operates by leaving N in the Ge—Sb—Te thin film according to a reaction condition.

In the Ge—Sb—Te thin-film forming step S20, the first to third precursors are mixed with the inert gas so as to be smoothly fed into the chamber 10. Alternatively, only the vaporized precursors may be fed into the chamber 10 according to the condition. The Ge—Sb—Te thin-film forming step S20 will now be described in detail.

As shown in FIG. 3, the Ge—Sb—Te thin-film forming step S20 is performed by sequentially performing a feeding step S21 of feeding the first precursor into the chamber 10 during a time t1, a purging step S22 of purging the first precursor using the inert gas during a time t2, a feeding step S23 of feeding the second precursor during a time t3, a purging step S24 of purging the second precursor using the inert gas during a time t4, a feeding step S25 of feeding the third precursor during a time t5, and a purging step S26 of purging the third precursor using the inert gas during a time t6.

At this time, the composition of the elements of the Ge—Sb—Te thin film can be adjusted by adjusting the vapor pressures and the temperatures of the first to third precursors, or adjusting the times t1, t3 and t5 for feeding the first to third precursors or the amount of carrier gas in a state where the vapor pressures and the temperatures are fixed.

For example, the amount of the first precursor fed into the chamber 10 is adjusted by increasing or decreasing the temperature of the first precursor to adjust the vapor pressure or adjusting the feeding time t1 or the amount of carrier gas in a state where the vapor pressure and the temperature of the first precursor are fixed. The amount of the second precursor fed into the chamber 10 is adjusted by increasing or decreasing the temperature of the second precursor to adjust the vapor pressure or adjusting the feeding time t3 or the amount of carrier gas in a state where the vapor pressure and the temperature of the second precursor are fixed. The amount of the third precursor fed into the chamber 10 is adjusted by increasing or decreasing the temperature of the third precursor to adjust the vapor pressure or adjusting the feeding time t5 or the amount of carrier gas in a state where the vapor pressure and the temperature of the third precursor are fixed. By adjusting the composition of the elements of the Ge—Sb—Te thin film, it is possible to realize a specific resistance suitable for the device. The purging times t2, t4 and t6 for purging the first to third precursors are preferably 10 seconds or less.

The Ge—Sb—Te thin-film forming step 20 performed during the times t1 to t6 is repeated several times to adjust the thickness of the formed film.

Second Embodiment

Figure 4:
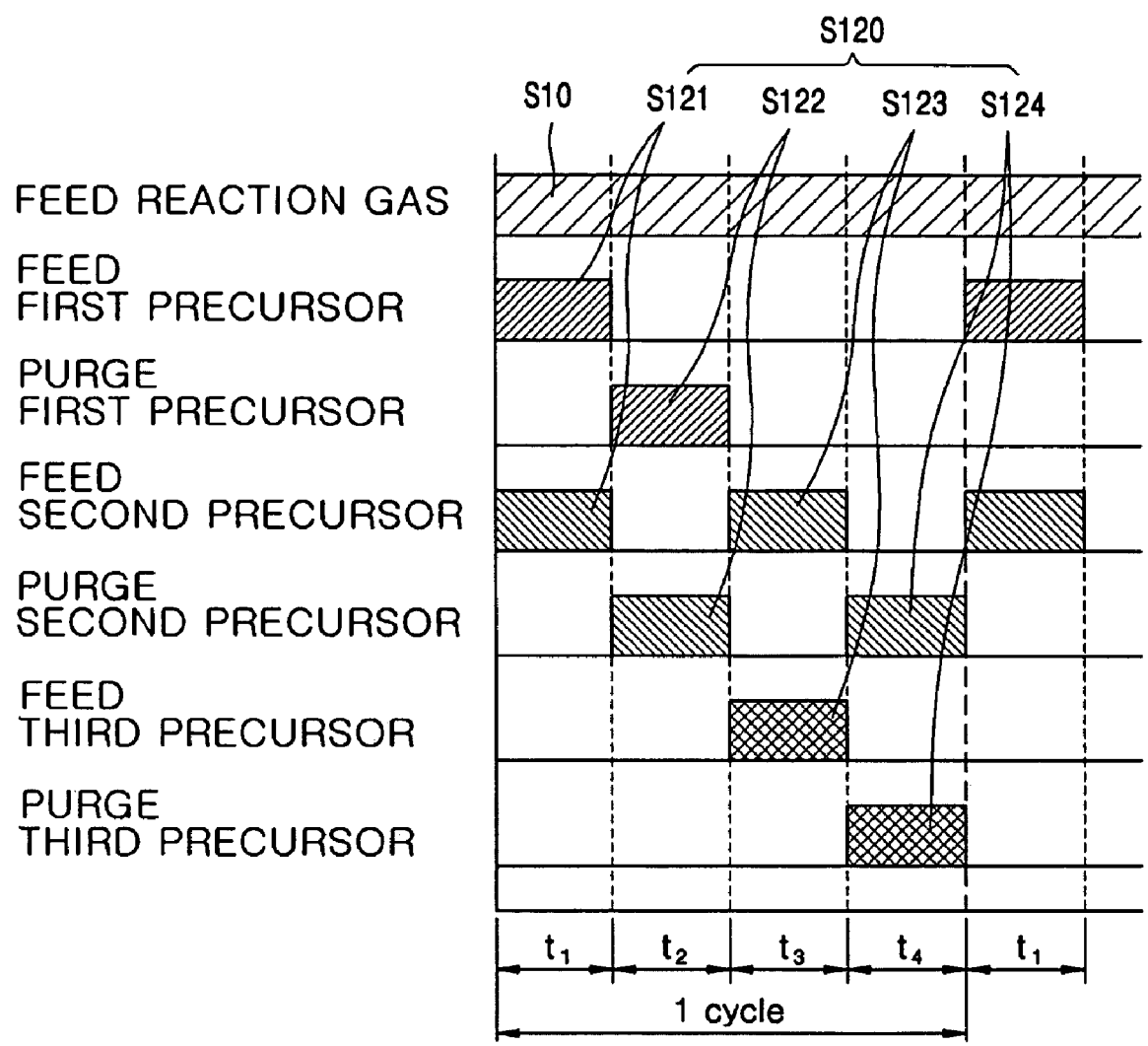
FIG. 4 is a view showing the flow of a method of depositing a Ge—Sb—Te thin film according to a second embodiment of the present invention.

FIG. 4 is a view showing the flow of a method of depositing a Ge—Sb—Te thin film according to a second embodiment of the present invention.

Referring to FIG. 4, the method of depositing the Ge—Sb—Te thin film according to the second embodiment of the present invention includes a Ge—Sb—Te thin-film forming step S120 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S10 of feeding the reaction gas into the chamber 10 while the first to third precursors are fed and purged, and a step of adjusting the thickness of the film formed by repeating the Ge—Sb—Te thin-film forming step S120.

As shown in FIG. 4, the Ge—Sb—Te thin-film forming step S120 is performed by sequentially performing a feeding step S121 of simultaneously feeding the first precursor and the second precursor into the chamber 10 during a time t1, a purging step S122 of simultaneously purging the first precursor and the second precursor using the inert gas during a time t2, a feeding step S123 of simultaneously feeding the second precursor and the third precursor during a time t3, and a purging step S124 of simultaneously purging the second precursor and the third precursor using the inert gas during a time t4.

At this time, the composition of the elements of the Ge—Sb—Te thin film can be adjusted by adjusting the vapor pressures and the temperatures of the first to third precursors or adjusting the time t1 for feeding the first and second precursors and the time t3 for feeding the second and third precursors or the amount of carrier gas in a state where the vapor pressures and the temperatures are fixed, similar to in the Ge—Sb—Te thin-film forming step S20 of the first embodiment. The time t2 for purging the first and second precursors and the time t4 for purging the second and third precursors are preferably 10 seconds or less.

In the present embodiment, since the first precursor and the second precursor are simultaneously fed and purged and the second precursor and the third precursor are simultaneously fed and purged, a total process time can shorten. The other is similar to that of the first embodiment and thus their description will be omitted.

Third Embodiment

Figure 5:
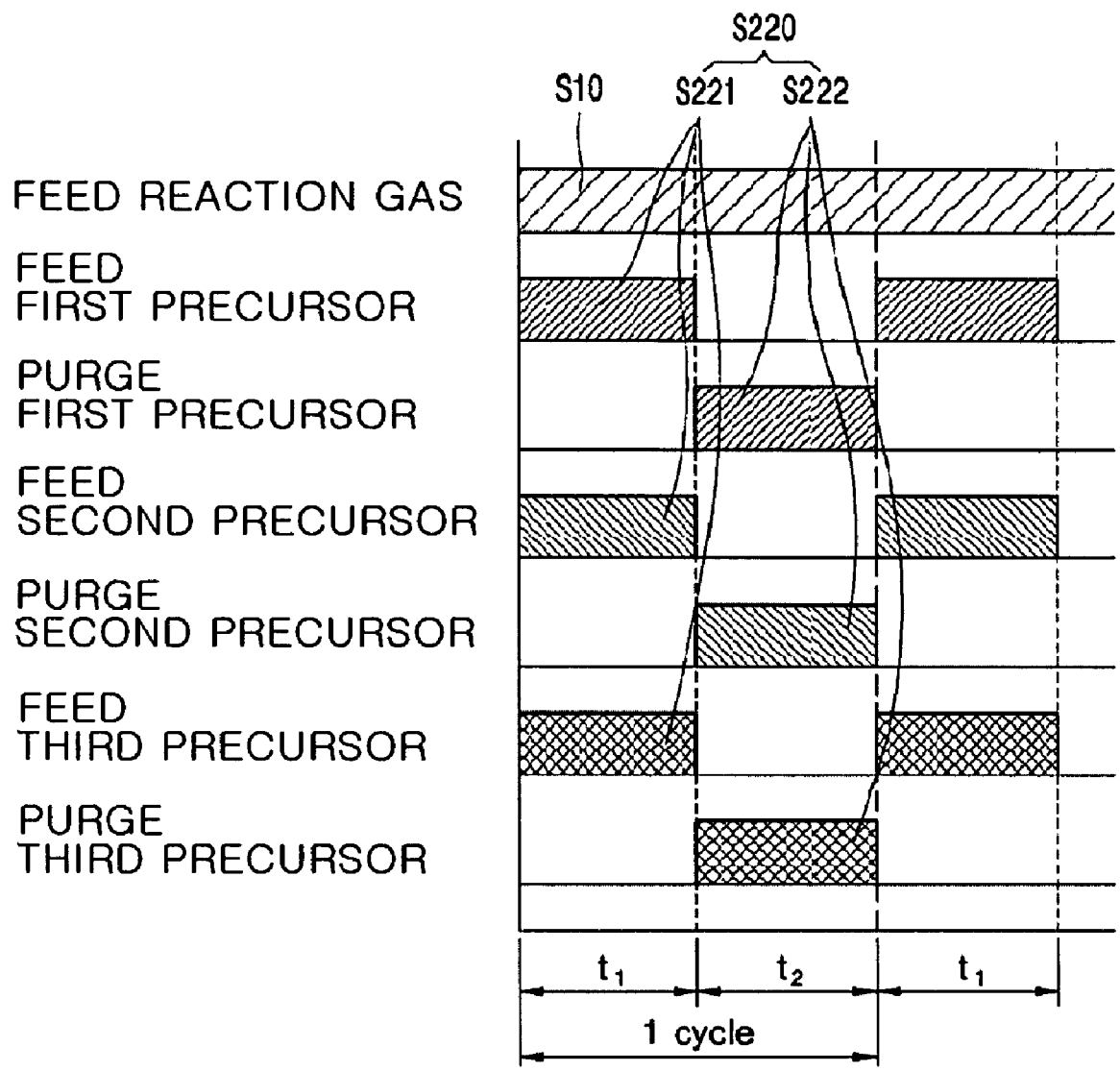
FIG. 5 is a view showing the flow of a method of depositing a Ge—Sb—Te thin film according to a third embodiment of the present invention.

FIG. 5 is a view showing the flow of a method of depositing a Ge—Sb—Te thin film according to a third embodiment of the present invention.

Referring to FIG. 5, the method of depositing the Ge—Sb—Te thin film according to the third embodiment of the present invention includes a Ge—Sb—Te thin-film forming step S220 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S10 of feeding the reaction gas into the chamber 10 while the first to third precursors are fed and purged, and a step of adjusting the thickness of the film formed by repeating the Ge—Sb—Te thin-film forming step S220.

As shown in FIG. 5, the Ge—Sb—Te thin-film forming step S220 is performed by sequentially performing a feeding step S221 of simultaneously feeding the first precursor, the second precursor and the third precursor into the chamber 10 during a time t1 and a purging step S222 of simultaneously purging the first precursor, the second precursor and the third precursor using the inert gas during a time t2.

At this time, the composition of the elements of the Ge—Sb—Te thin film can be adjusted by adjusting the vapor pressures and the temperatures of the first to third precursors or adjusting the time t1 for feeding the first to third precursors or the amount of carrier gas in a state where the vapor pressures and the temperatures are fixed, similar to in the Ge—Sb—Te thin-film forming step S20 of the first embodiment. The time t2 for purging the first to third precursors is preferably 10 seconds or less.

In the present embodiment, since the first to third precursors are simultaneously fed and purged, a total process time can shorten. The other is similar to that of the first embodiment and thus their description will be omitted.

Fourth Embodiment

Figure 6:
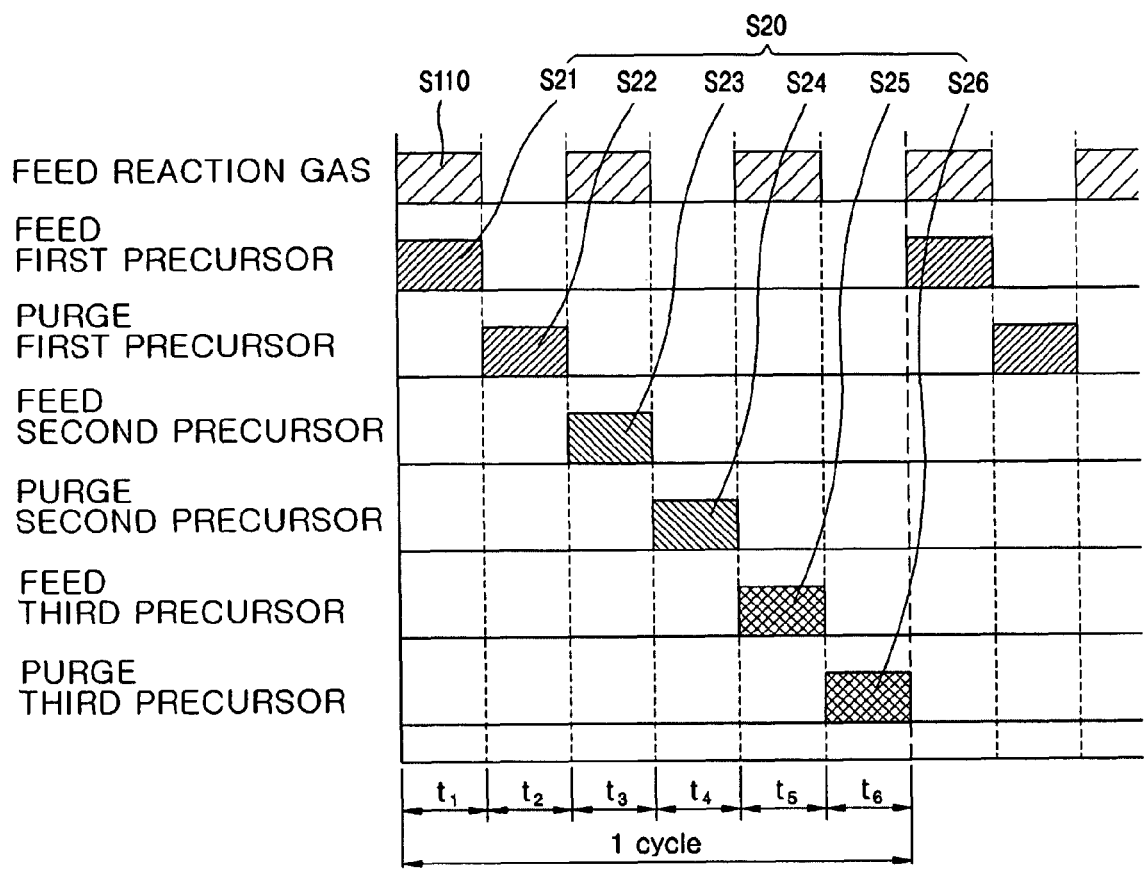
FIG. 6 is a view showing the flow of a method of depositing a Ge—Sb—Te thin film according to a fourth embodiment of the present invention.

FIG. 6 is a view showing the flow of a method of depositing a Ge—Sb—Te thin film according to a fourth embodiment of the present invention, which is a modified example of the first embodiment.

Referring to FIG. 6, the method of depositing the Ge—Sb—Te thin film according to the fourth embodiment of the present invention includes a Ge—Sb—Te thin-film forming step S20 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S110 of feeding the reaction gas into the chamber 10 only while the first to third precursors are fed, and a step of adjusting the thickness of the film formed by repeating the Ge—Sb—Te thin-film forming step S20.

The present embodiment is different from the first embodiment in that the reaction gas is fed in only the steps S21, S23 and S25 of feeding the first to third precursors but is not fed in the steps S22, S24 and S26 of purging the first to third precursors. The other is similar to that of the first embodiment and thus their description will be omitted. That is, according to the present embodiment, the reaction gas is discontinuously fed in the steps of feeding the precursors.

Fifth Embodiment

Figure 7:
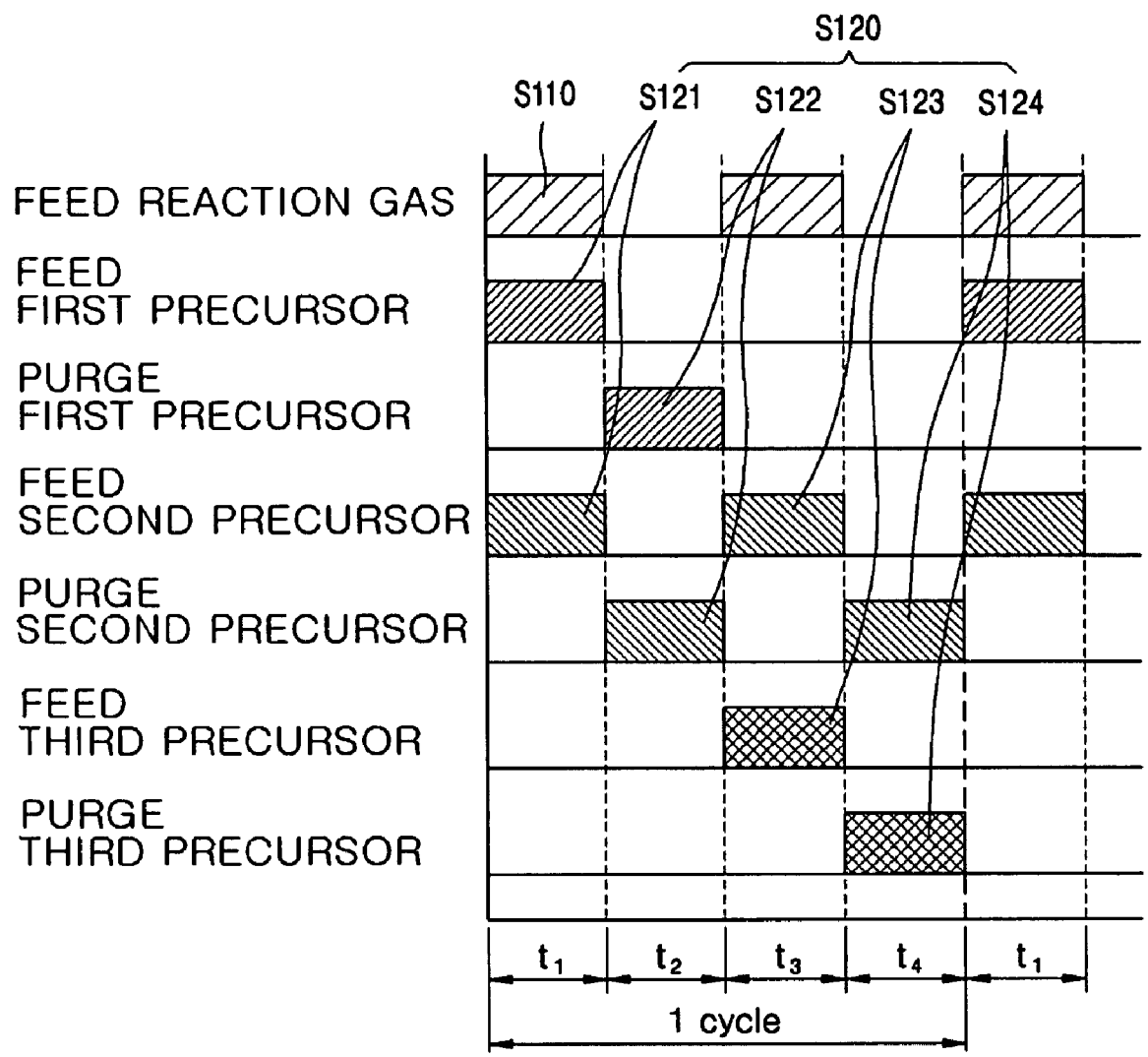
FIG. 7 is a view showing the flow of a method of depositing a Ge—Sb—Te thin film according to a fifth embodiment of the present invention.

FIG. 7 is a view showing the flow of a method of depositing a Ge—Sb—Te thin film according to a fifth embodiment of the present invention, which is a modified example of the second embodiment.

Referring to FIG. 7, the method of depositing the Ge—Sb—Te thin film according to the fifth embodiment of the present invention includes a Ge—Sb—Te thin-film forming step S120 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S110 of feeding the reaction gas into the chamber 10 only while the first to third precursors are fed, and a step of adjusting the thickness of the film formed by repeating the Ge—Sb—Te thin-film forming step S120.

The present embodiment is different from the second embodiment in that the reaction gas is fed in the step S121 of feeding the first and second precursors and the step S123 of feeding the second and third precursors but is not fed in the step S122 of purging the first and second precursors and the step S124 of purging the second and third precursors. The other is similar to that of the second embodiment and thus their description will be omitted.

Sixth Embodiment

Figure 8:
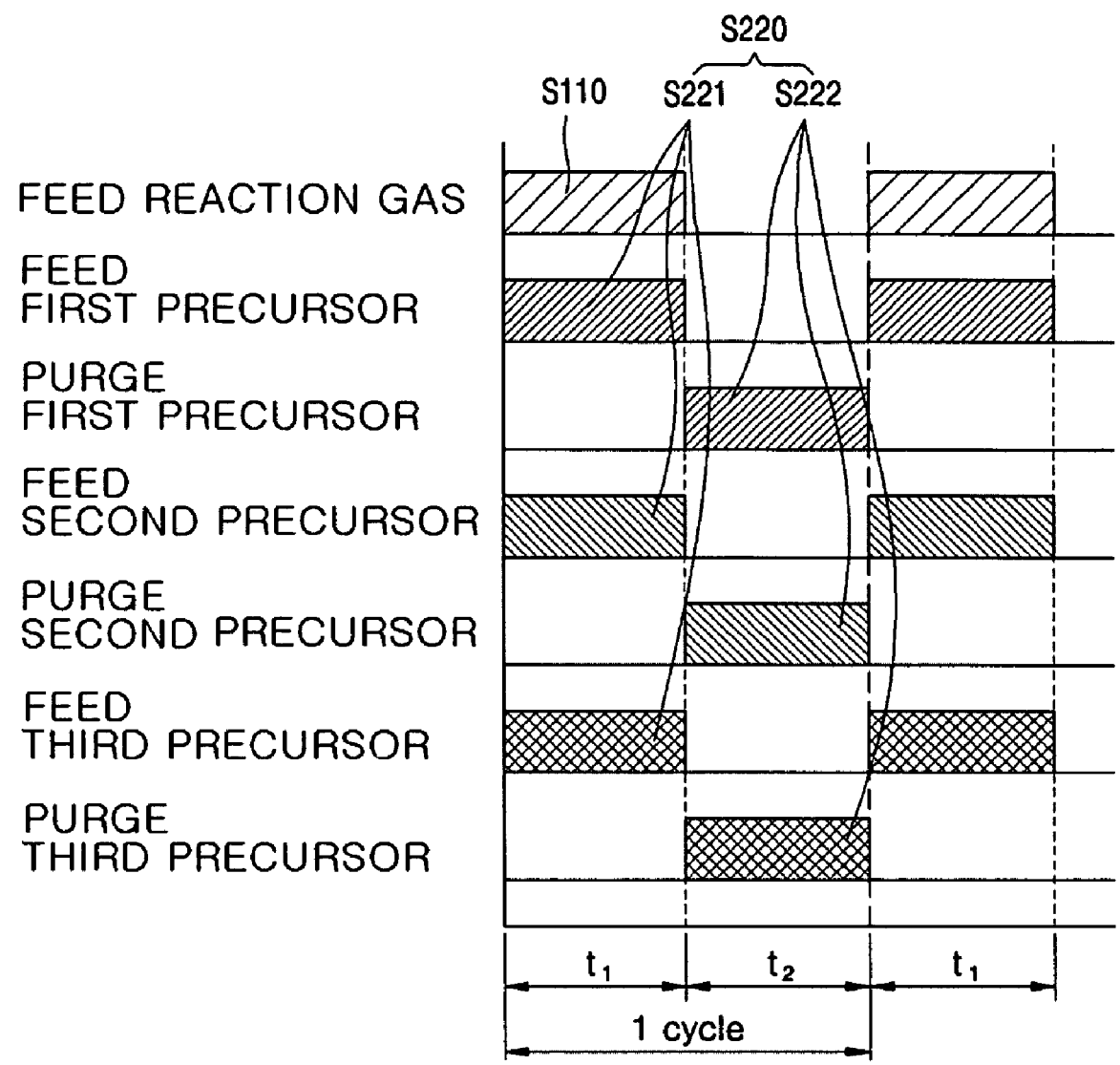
FIG. 8 is a view showing the flow of a method of depositing a Ge—Sb—Te thin film according to a sixth embodiment of the present invention.

FIG. 8 is a view showing the flow of a method of depositing a Ge—Sb—Te thin film according to a sixth embodiment of the present invention, which is a modified example of the third embodiment.

Referring to FIG. 8, the method of depositing the Ge—Sb—Te thin film according to the sixth embodiment of the present invention includes a Ge—Sb—Te thin-film forming step S220 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S110 of feeding the reaction gas into the chamber 10 only while the first to third precursors are fed, and a step of adjusting the thickness of the film formed by repeating the Ge—Sb—Te thin-film forming step S220.

The present embodiment is different from the third embodiment in that the reaction gas is fed in the step S221 of feeding the first to third precursors but is not fed in the step S222 of purging the first to third precursors. The other is similar to that of the third embodiment and thus their description will be omitted.

Method of Using Plasma Further

Figure 9:
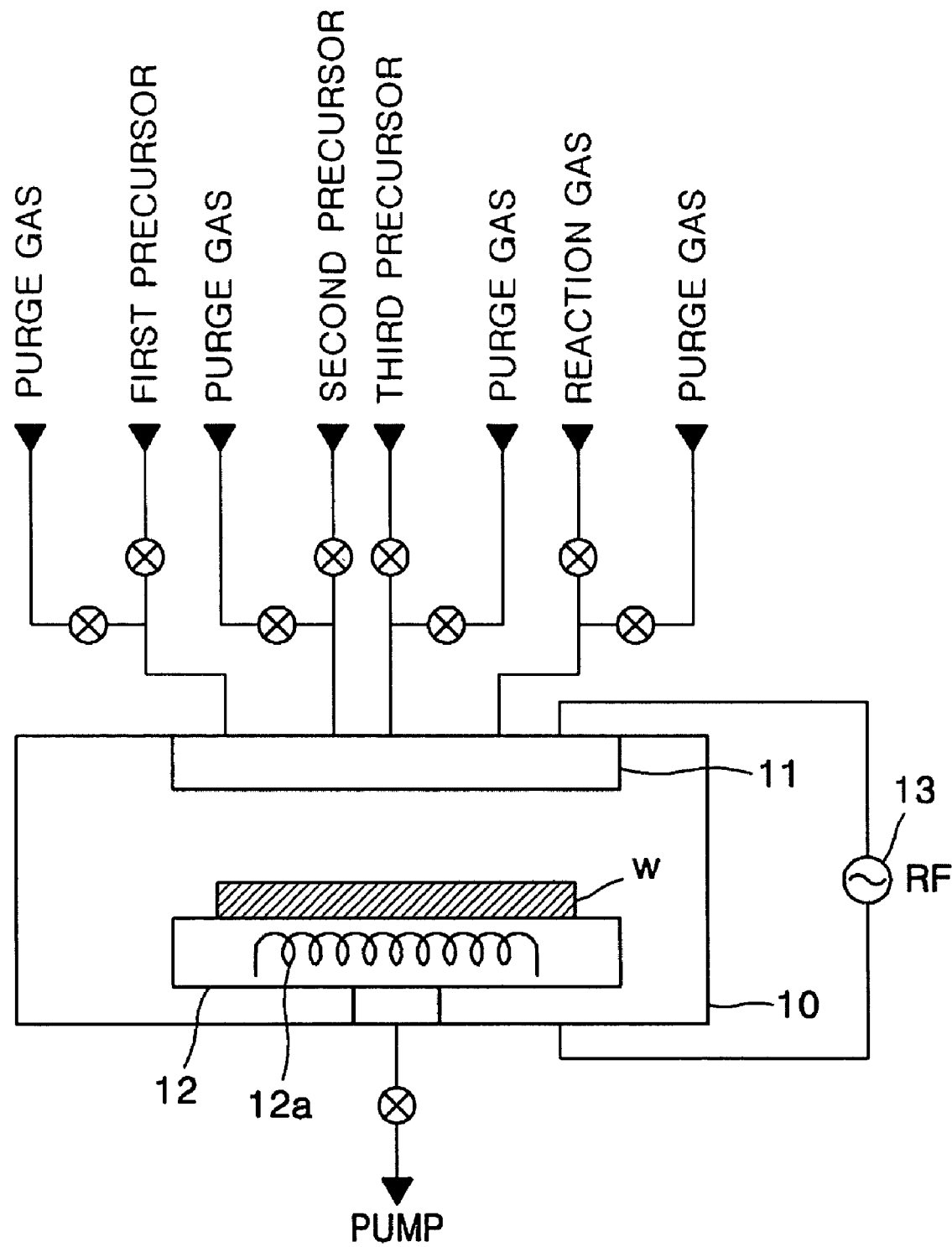
FIG. 9 is a view showing the configuration of a thin-film depositing apparatus which can perform methods of depositing a Ge—Sb—Te thin film according to seventh to fourteenth embodiments of the present invention.
Figure 10:
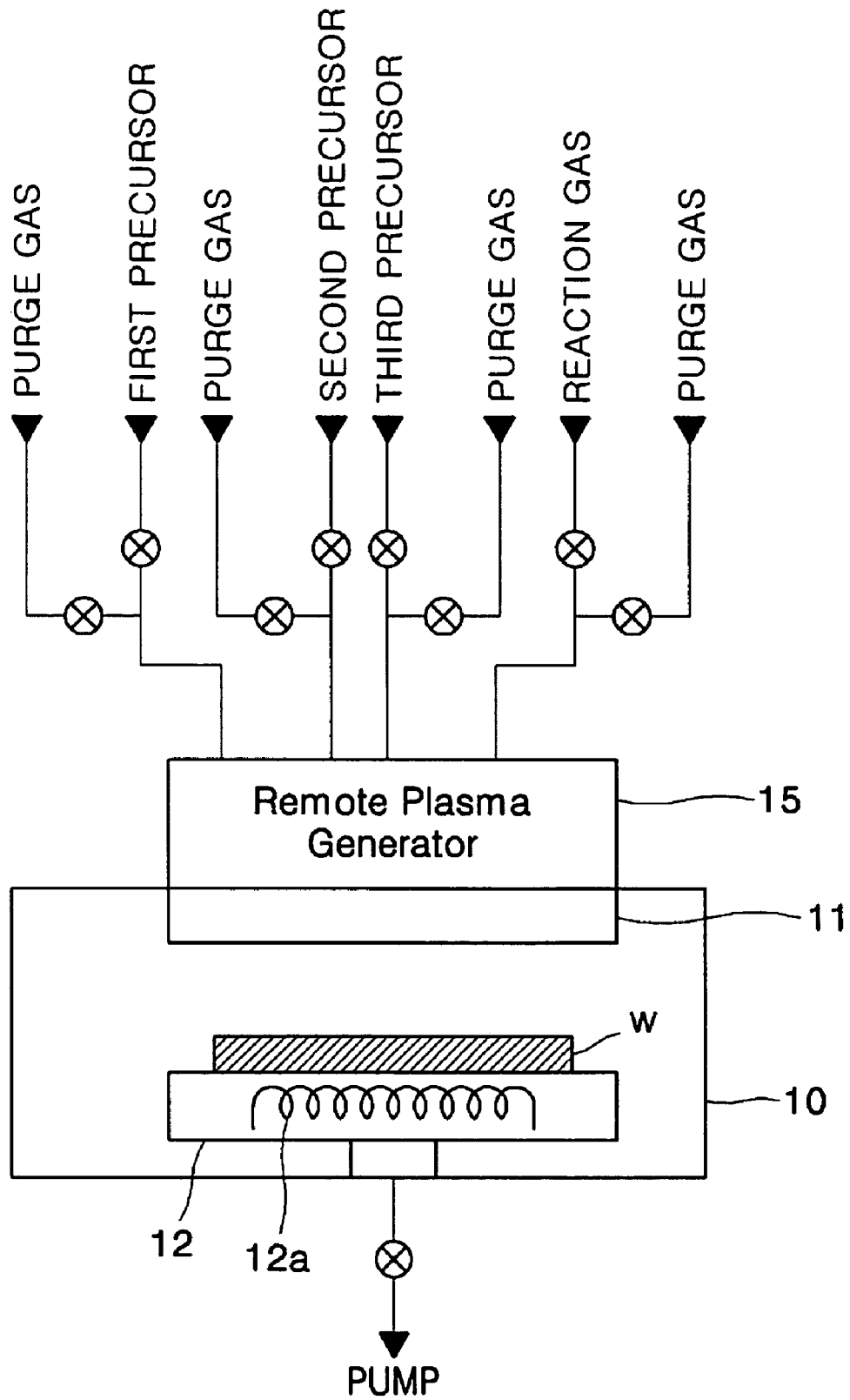
FIG. 10 is a view showing the configuration of another thin-film depositing apparatus which can perform methods of depositing a Ge—Sb—Te thin film according to the seventh to fourteenth embodiments of the present invention.

FIGS. 9 and 10 are views showing the configurations of thin-film depositing apparatuses which can perform methods of depositing the Ge—Sb—Te thin film according to seventh to fourteenth embodiments of the present invention.

First, the thin-film depositing apparatus shown in FIG. 9 is substantially similar to the thin-film depositing apparatus shown in FIG. 1 except that a plasma generator 13 is connected such that plasma is directly applied into the chamber 10. At this time, the plasma applied into the chamber 10 has a low frequency of 300 to 500 KHz and/or a high frequency of 13.56 MHz to 21.12 MHz and power of 50 to 2000 W. The chamber 10 has the three gas lines connected to the shower head 11 such that the first to third precursors are separately introduced.

Although not shown, the thin-film depositing apparatus shown in FIG. 2, in which the first to third precursors are introduced through one gas line, may be used in the seventh to fourteenth embodiments of the present invention by including the plasma generator 13.

Next, the thin-film depositing apparatus shown in FIG. 10 is substantially similar to the thin-film depositing apparatus shown in FIG. 1 except that a remote plasma generator 15 is outside the chamber 10 such that gas is radicalized at the outside of the chamber 10 and fed into the chamber 10.

The thin-film depositing apparatus shown in FIG. 2 may be used in the seventh to fourteenth embodiments of the present invention by including the remote plasma generator 15.

Hereinafter, the method of depositing the Ge—Sb—Te thin film will be described using the above-described thin-film depositing apparatus using the plasma in addition to the thermal method.

Seventh Embodiment

Figure 11:
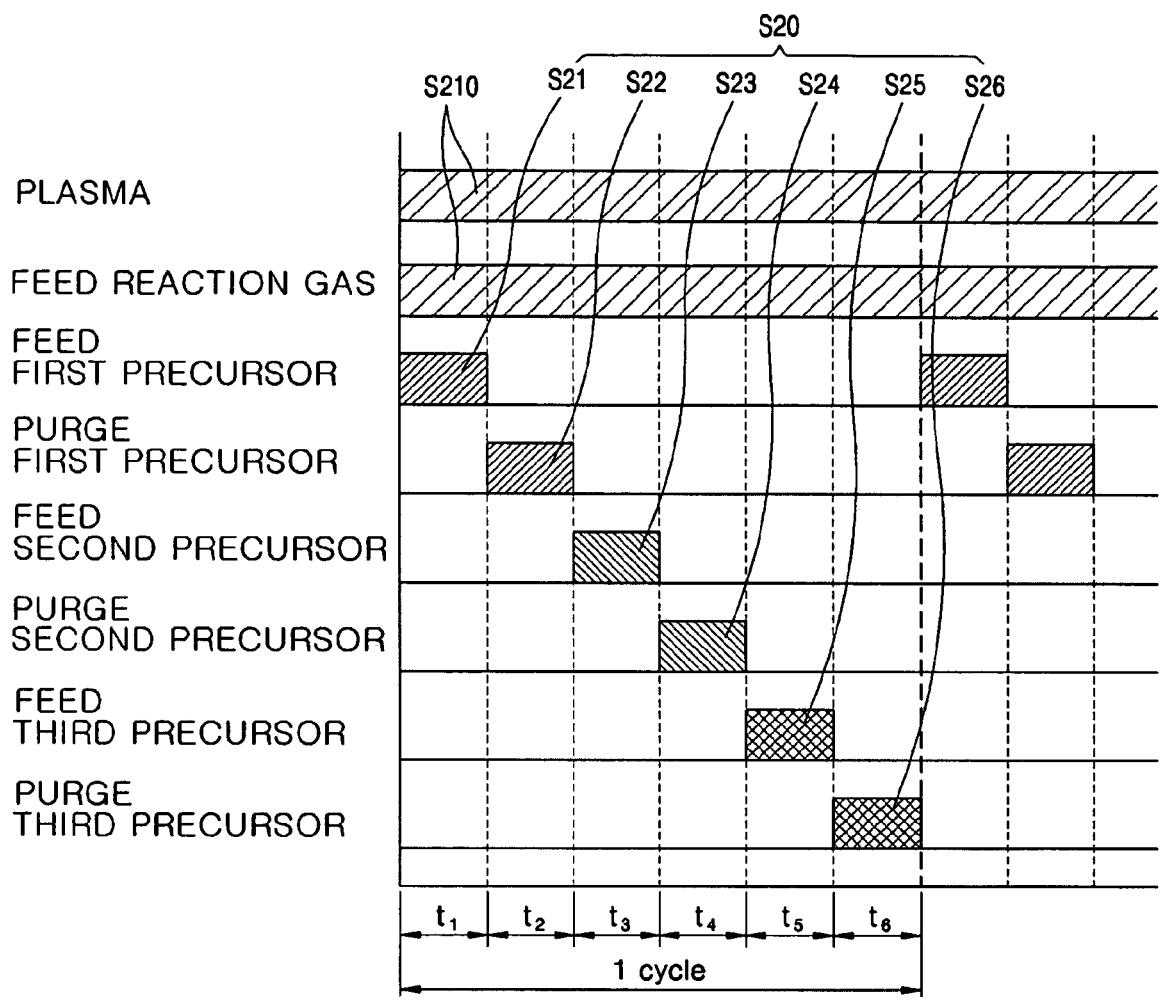
FIG. 11 is a view showing the flow of a method of depositing a Ge—Sb—Te thin film according to a seventh embodiment of the present invention.

FIG. 11 is a view showing the flow of a method of depositing a Ge—Sb—Te thin film according to a seventh embodiment of the present invention.

Referring to FIG. 11, the method of depositing the Ge—Sb—Te thin film according to the seventh embodiment of the present invention includes a Ge—Sb—Te thin-film forming step S20 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer, a reaction gas feeding step S210 of feeding the reaction gas into the chamber 10 while the first to third precursors are fed and purged, and a step of adjusting the thickness of the film formed by repeating the Ge—Sb—Te thin-film forming step S20. In the reaction gas feeding step S210, the plasma is applied into the chamber 10 while the reaction gas is fed.

In the reaction gas feeding step S210, at least one selected from the group consisting of $H_2$, $NH_3$ and He and a mixture of the at least one selected from the group consisting of $H_2$, $NH_3$ and He and the inert gas is fed into the chamber 10 in a state that the plasma is applied. He may be used together with Ar. He and Ar are the inert gas, function as the inert gas which does not react with the precursors when the plasma is not used, and function as the reaction gas which is ionized to decompress the precursors when the plasma is used. He changes the property of the plasma when the plasma is applied and leaves impurities C which exists in the precursors in the Ge—Sb—Te thin film. This is similar to the doping of the impurities C into the Ge—Sb—Te thin film. The doping of the impurities C decreases an operation voltage when an actual device operates. Since $H_2$ serves to remove the impurities C from the Ge—Sb—Te thin film, the usage object and the role of $H_2$ is opposite to those of He. When the $H_2$, He and Ar are mixed, a desired concentration of impurities C can be obtained.

The reaction gas is activated by the plasma and reacts with the first to third precursors introduced into the chamber 10 to deposit the Ge—Sb—Te thin film on the wafer w in the chamber 10 and the heated wafer w. At this time, the plasma may be applied by a direct plasma method of directly applying the plasma into the chamber 10 using the thin-film depositing apparatus shown in FIG. 9 or a remote plasma method of applying the plasma reaction gas into the chamber 10 using the thin-film depositing apparatus shown in FIG. 10. Only the reaction gas may be fed and a mixture of the reaction gas and the inert gas may be fed.

The present embodiment is different from the first embodiment in that the plasma is applied into the chamber 10 while the reaction gas is fed. The other is similar to that of the first embodiment and thus their description will be omitted. Since the reaction gas is activated by the plasma, a deposition rate can increase.

Eighth Embodiment

Figure 12:
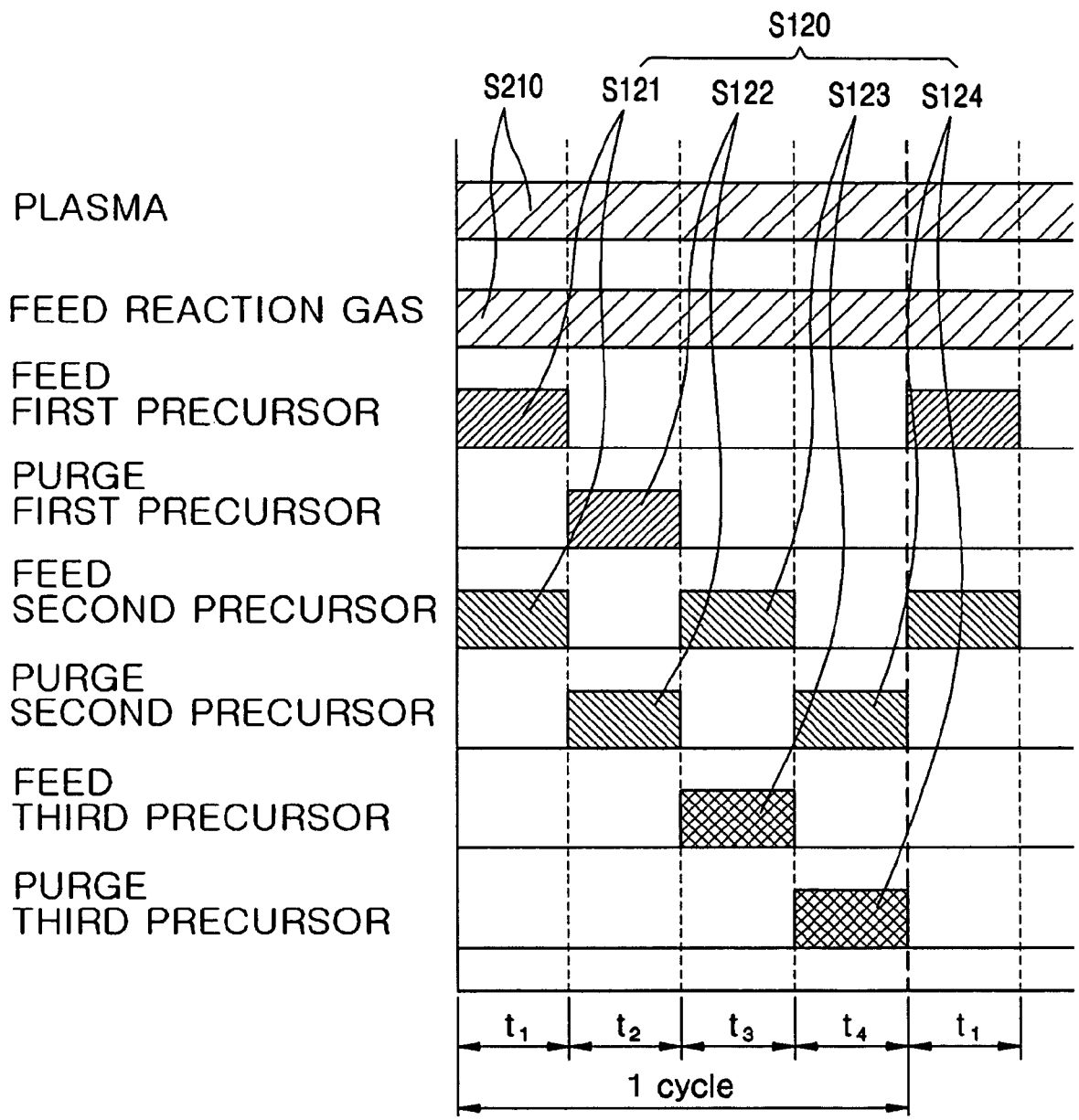
FIG. 12 is a view showing the flow of a method of depositing a Ge—Sb—Te thin film according to an eighth embodiment of the present invention.

FIG. 12 is a view showing the flow of a method of depositing a Ge—Sb—Te thin film according to an eighth embodiment of the present invention.

Referring to FIG. 12, the method of depositing the Ge—Sb—Te thin film according to the eighth embodiment of the present invention includes a Ge—Sb—Te thin-film forming step S120 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer, a reaction gas feeding step S210 of feeding the reaction gas into the chamber 10 while the first to third precursors are fed and purged, and a step of adjusting the thickness of the film formed by repeating the Ge—Sb—Te thin-film forming step S120. In the reaction gas feeding step S210, the plasma is applied into the chamber 10 while the reaction gas is fed.

The present embodiment is different from the second embodiment in that the plasma is applied into the chamber 10 while the reaction gas is fed. The other is similar to that of the second embodiment and thus their description will be omitted.

Ninth Embodiment

Figure 13:
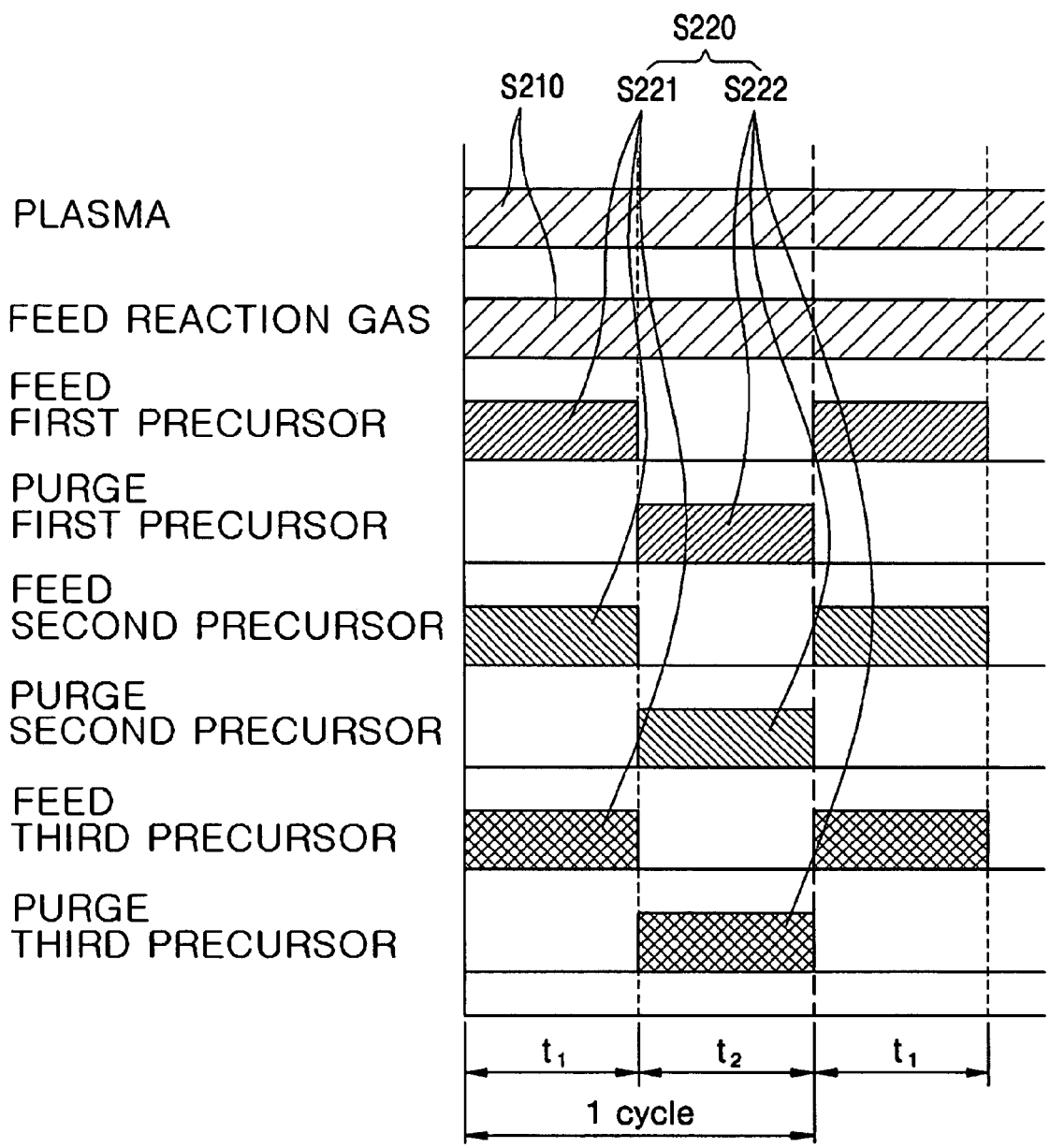
FIG. 13 is a view showing the flow of a method of depositing a Ge—Sb—Te thin film according to a ninth embodiment of the present invention.

FIG. 13 is a view showing the flow of a method of depositing a Ge—Sb—Te thin film according to a ninth embodiment of the present invention.

Referring to FIG. 13, the method of depositing the Ge—Sb—Te thin film according to the ninth embodiment of the present invention includes a Ge—Sb—Te thin-film forming step S220 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer, a reaction gas feeding step S210 of feeding the reaction gas into the chamber 10 while the first to third precursors are fed and purged, and a step of adjusting the thickness of the film formed by repeating the Ge—Sb—Te thin-film forming step S220. In the reaction gas feeding step S210, the plasma is applied into the chamber 10 while the reaction gas is fed.

The present embodiment is different from the third embodiment in that the plasma is applied into the chamber 10 while the reaction gas is fed. The other is similar to that of the third embodiment and thus their description will be omitted.

Tenth Embodiment

Figure 14:
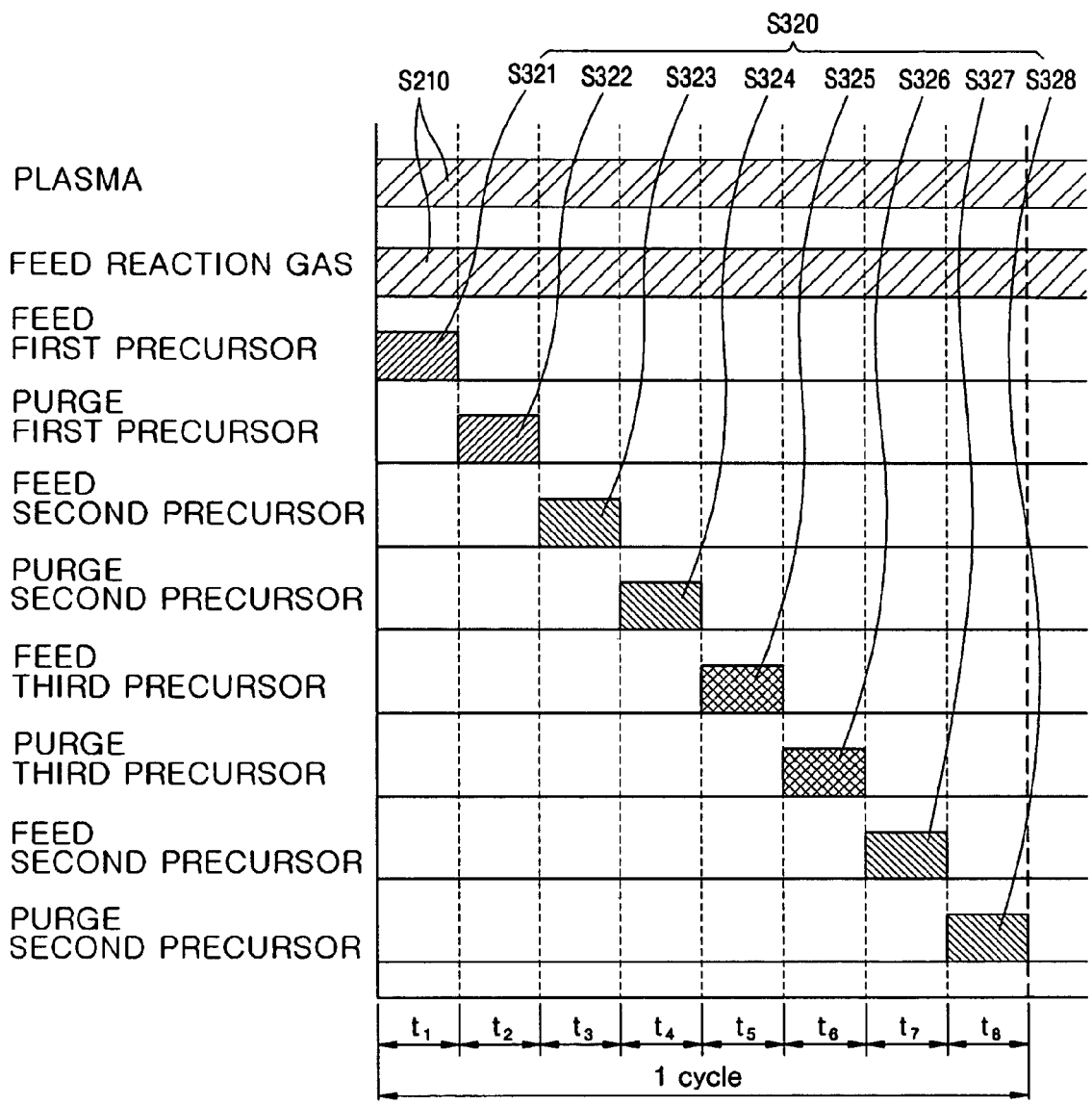
FIG. 14 is a view showing the flow of a method of depositing a Ge—Sb—Te thin film according to a tenth embodiment of the present invention.

FIG. 14 is a view showing the flow of a method of depositing a Ge—Sb—Te thin film according to a tenth embodiment of the present invention.

Referring to FIG. 14, the method of depositing the Ge—Sb—Te thin film according to the tenth embodiment of the present invention includes a Ge—Sb—Te thin-film forming step S320 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer, a reaction gas feeding step S210 of feeding the reaction gas into the chamber 10 while the first to third precursors are fed and purged, and a step of adjusting the thickness of the film formed by repeating the Ge—Sb—Te thin-film forming step S320. In the reaction gas feeding step S210, the plasma is applied into the chamber 10 while the reaction gas is fed.

As shown in FIG. 14, the Ge—Sb—Te thin-film forming step S320 is performed sequentially performing a feeding step S321 of feeding the first precursor into the chamber 10 during a time t1, a purging step S322 of purging the first precursor using the inert gas during a time t2, a feeding step S323 of feeding the second precursor during a time t3, a purging step S324 of purging the second precursor using the inert gas during a time t4, a feeding step S325 of feeding the third precursor during a time t5, a purging step S326 of purging the third precursor using the inert gas during a time t6, a feeding step S327 of feeding the second precursor again during a time t7, and a purging step S328 of purging the second precursor again using the inert gas. Here, the first precursor includes Ge, the second precursor includes Te, and the third precursor includes Sb.

At this time, the composition of the elements of the Ge—Sb—Te thin film can be adjusted by adjusting the vapor pressures and the temperatures of the first to third precursors or adjusting the times t1, t3 t5 and t7 for feeding the first to third precursors or the amount of carrier gas in a state where the vapor pressures and the temperatures are fixed, similar to the first embodiment.

Eleventh Embodiment

Figure 15:
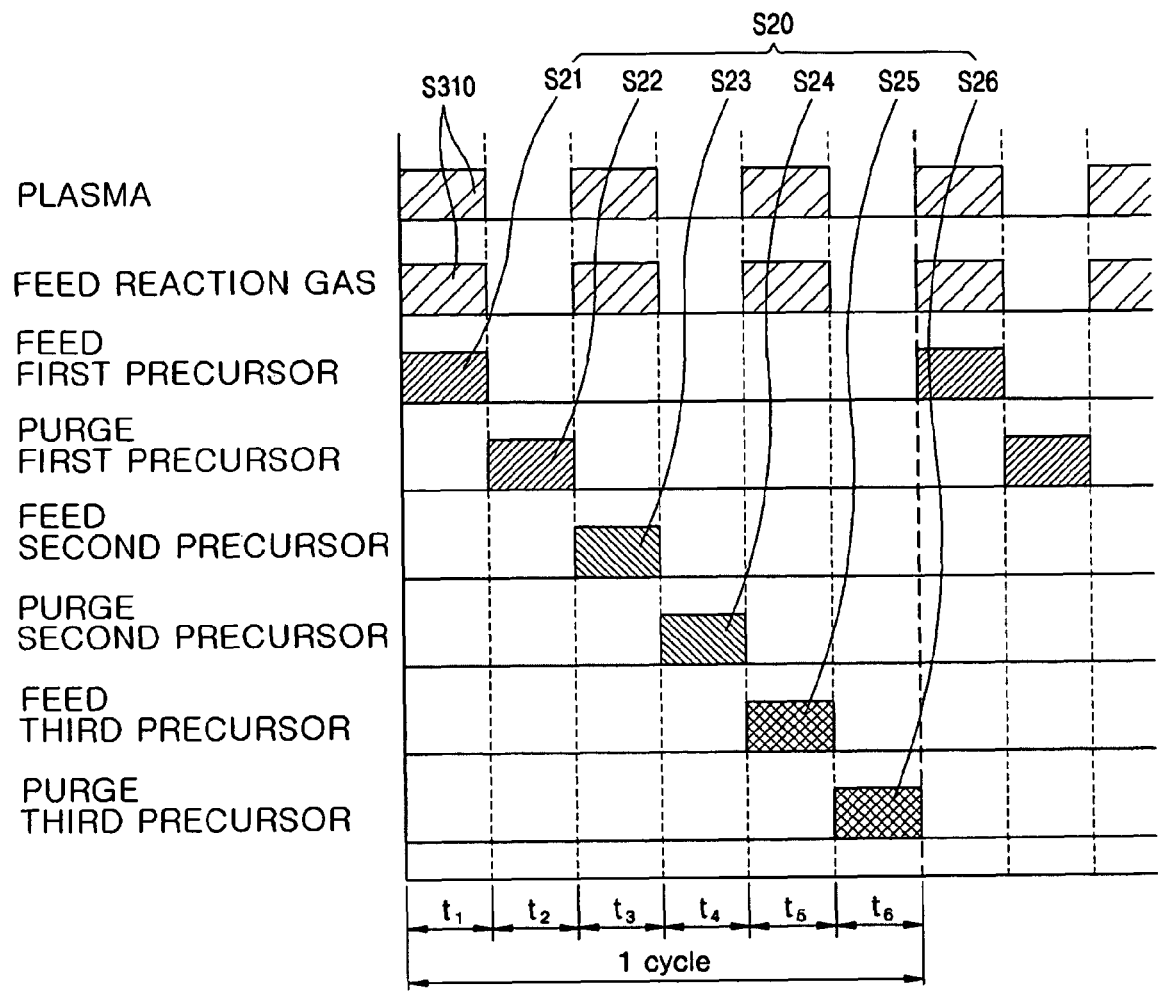
FIG. 15 is a view showing the flow of a method of depositing a Ge—Sb—Te thin film according to an eleventh embodiment of the present invention.

FIG. 15 is a view showing the flow of a method of depositing a Ge—Sb—Te thin film according to an eleventh embodiment of the present invention, which is a modified example of the seventh embodiment.

Referring to FIG. 15, the method of depositing the Ge—Sb—Te thin film according to the eleventh embodiment of the present invention includes a Ge—Sb—Te thin-film forming step S20 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S310 of feeding the reaction gas into the chamber 10 only while the first to third precursors are fed, and a step of adjusting the thickness of the film formed by repeating the Ge—Sb—Te thin-film forming step S20. In the reaction gas feeding step S310, the plasma is applied into the chamber 10 while the reaction gas is fed.

The present embodiment is different from the seventh embodiment in that the reaction gas is fed and the plasma is applied in only the steps S21, S23 and S25 of feeding the first to third precursors. The other is similar to that of the seventh embodiment and thus their description will be omitted. That is, according to the present embodiment, the plasma is discontinuously applied in the steps of feeding the reaction gas.

Twelfth Embodiment

Figure 16:
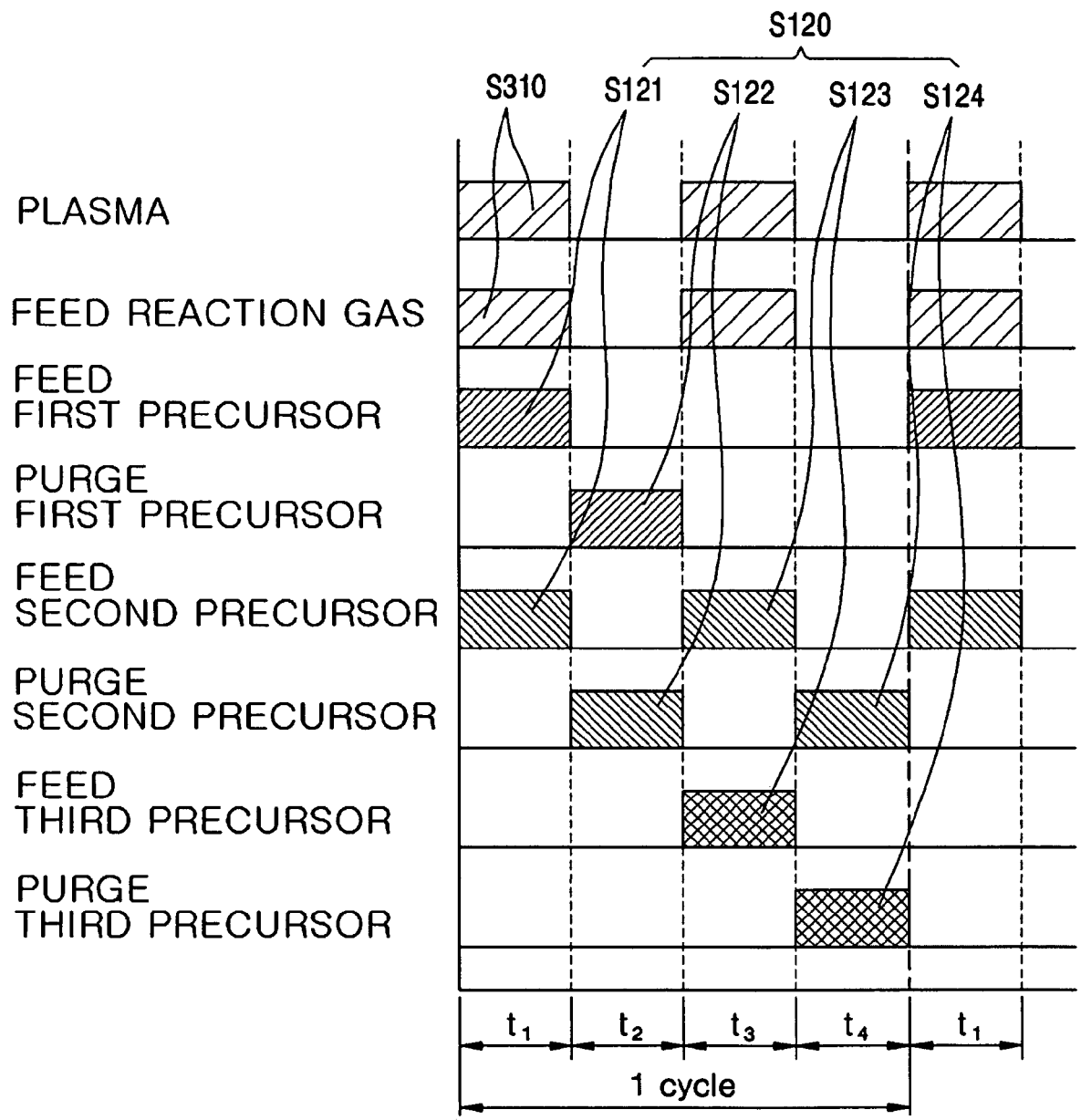
FIG. 16 is a view showing the flow of a method of depositing a Ge—Sb—Te thin film according to a twelfth embodiment of the present invention.

FIG. 16 is a view showing the flow of a method of depositing a Ge—Sb—Te thin film according to a twelfth embodiment of the present invention, which is a modified example of the eighth embodiment.

Referring to FIG. 16, the method of depositing the Ge—Sb—Te thin film according to the twelfth embodiment of the present invention includes a Ge—Sb—Te thin-film forming step S120 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S310 of feeding the reaction gas into the chamber 10 only while the first to third precursors are fed, and a step of adjusting the thickness of the film formed by repeating the Ge—Sb—Te thin-film forming step S120. In the reaction gas feeding step S310, the plasma is applied into the chamber 10 while the reaction gas is fed.

The present embodiment is different from the eighth embodiment in that the reaction gas is fed and the plasma is applied in only the step S121 of feeding the first and second precursors and the step S123 of feeding the second and third precursors. The other is similar to that of the eighth embodiment and thus their description will be omitted.

Thirteenth Embodiment

Figure 17:
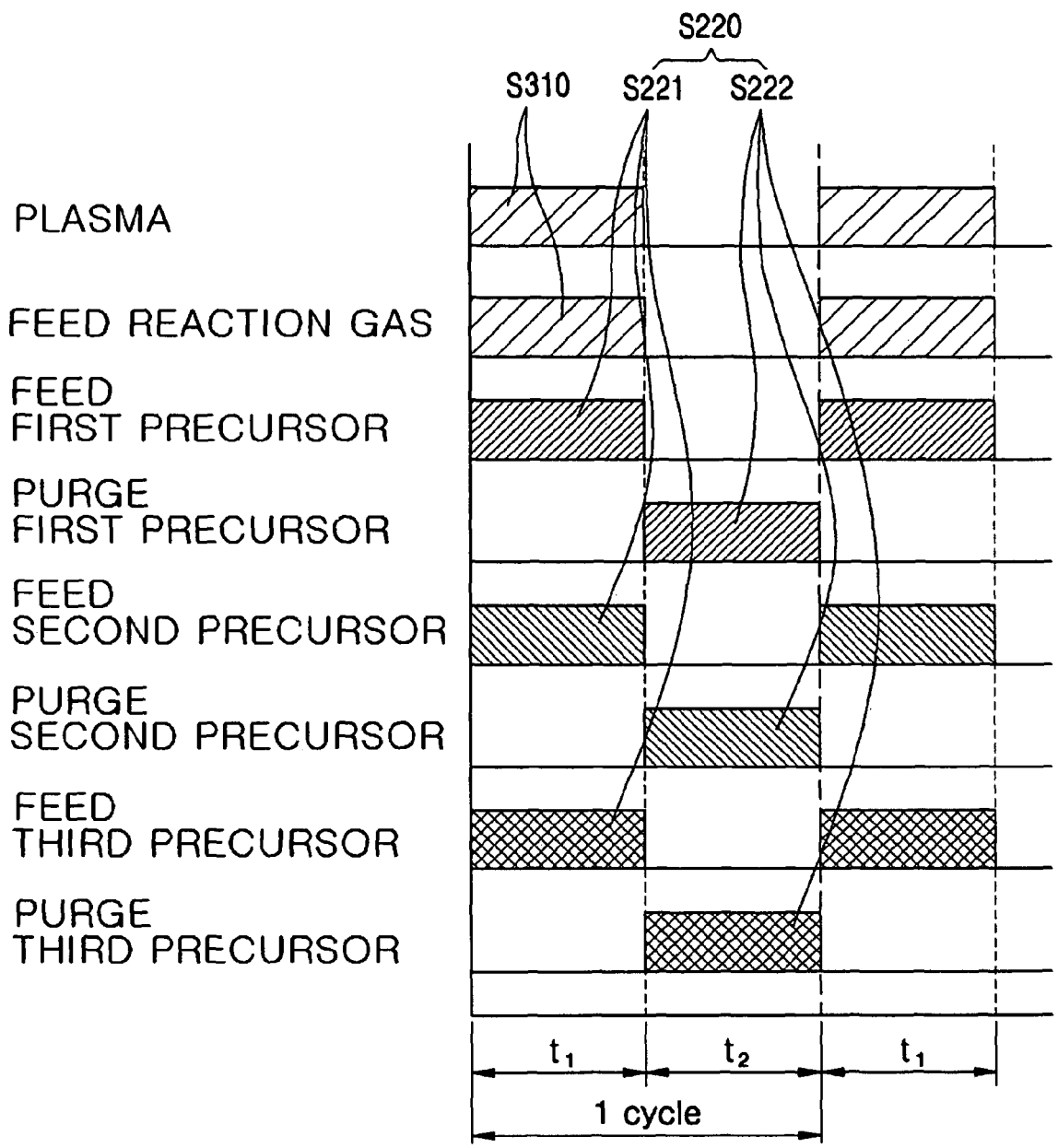
FIG. 17 is a view showing the flow of a method of depositing a Ge—Sb—Te thin film according to a thirteenth embodiment of the present invention.

FIG. 17 is a view showing the flow of a method of depositing a Ge—Sb—Te thin film according to a thirteenth embodiment of the present invention, which is a modified example of the ninth embodiment.

Referring to FIG. 17, the method of depositing the Ge—Sb—Te thin film according to the thirteenth embodiment of the present invention includes a Ge—Sb—Te thin-film forming step S220 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S310 of feeding the reaction gas into the chamber 10 only while the first to third precursors are fed, and a step of adjusting the thickness of the film formed by repeating the Ge—Sb—Te thin-film forming step S220. In the reaction gas feeding step S310, the plasma is applied into the chamber 10 while the reaction gas is fed.

The present embodiment is different from the ninth embodiment in that the reaction gas is fed and the plasma is applied in only the step S221 of feeding the first to third precursors. The other is similar to that of the ninth embodiment and thus their description will be omitted.

Fourteenth Embodiment

Figure 18:
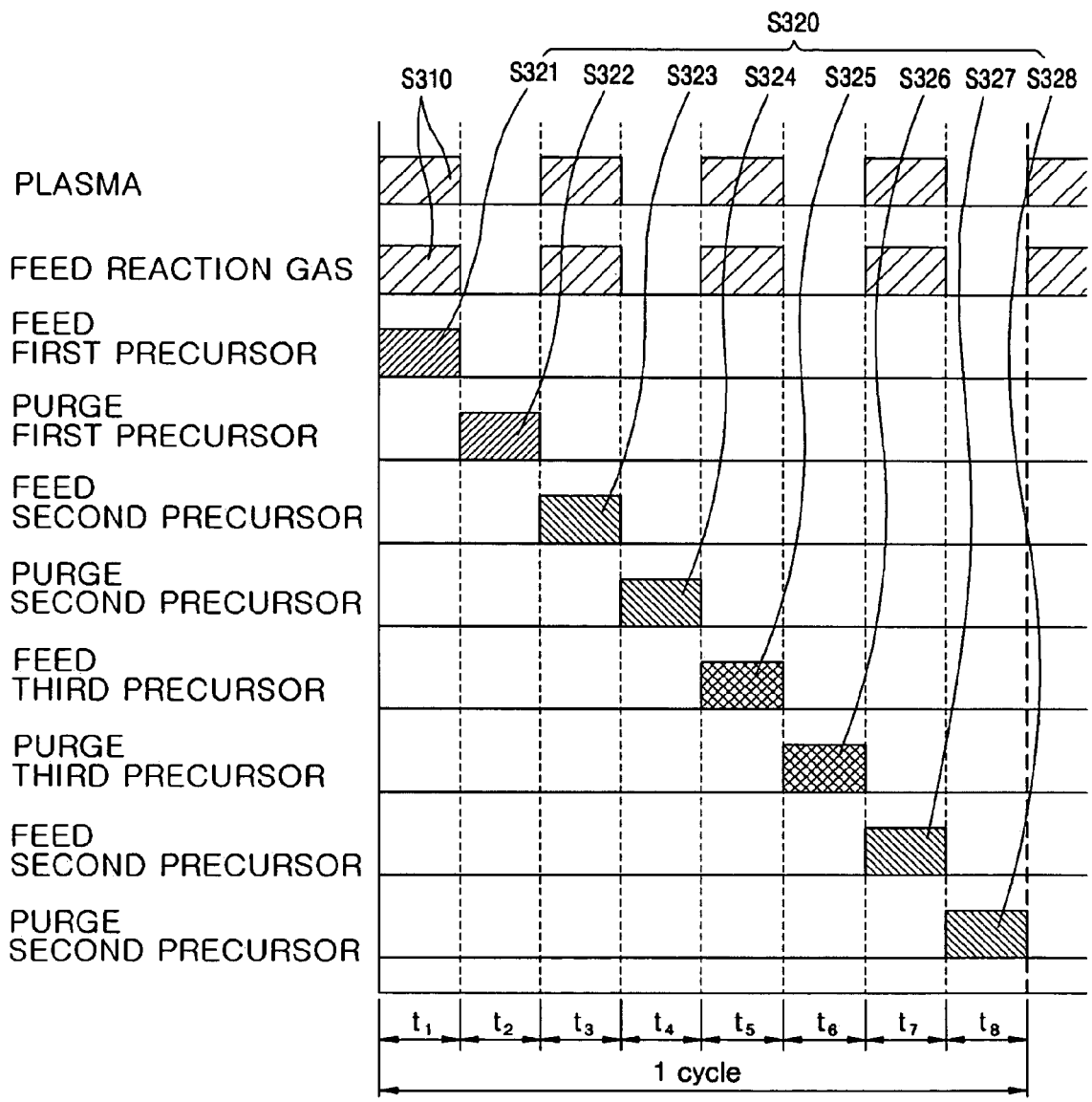
FIG. 18 is a view showing the flow of a method of depositing a Ge—Sb—Te thin film according to a fourteenth embodiment of the present invention.

FIG. 18 is a view showing the flow of a method of depositing a Ge—Sb—Te thin film according to a fourteenth embodiment of the present invention, which is a modified example of the tenth embodiment.

Referring to FIG. 18, the method of depositing the Ge—Sb—Te thin film according to the fourteenth embodiment of the present invention includes a Ge—Sb—Te thin-film forming step S320 of feeding and purging the first precursor including any one of Ge, Sb and Te, the second precursor including another one of Ge, Sb and Te and the third precursor including the other one of Ge, Sb and Te into and from the chamber 10 in which the wafer w is mounted to deposit the Ge—Sb—Te thin film on the wafer w, a reaction gas feeding step S310 of feeding the reaction gas into the chamber 10 only while the first to third precursors are fed, and a step of adjusting the thickness of the film formed by repeating the Ge—Sb—Te thin-film forming step S320. In the reaction gas feeding step S310, the plasma is applied into the chamber 10 while the reaction gas is fed.

The present embodiment is different from the tenth embodiment in that the reaction gas is fed and the plasma is applied in only the steps S321, S323, S325 and S327 of feeding the first to third precursors. The other is similar to that of the tenth embodiment and thus their description will be omitted.

As described above, according to a method of depositing a Ge—Sb—Te thin film of the present invention, during reaction gas including $H_2$ or $NH_3$ is fed, a precursor including Ge, a precursor including Sb and a precursor including Te are fed and purged while adjusting the amount of precursors. Thus, it is possible to efficiently deposit the Ge—Sb—Te thin film on a wafer.

At this time, the composition of the elements of the Ge—Sb—Te thin film can be adjusted by adjusting the vapor pressures and the temperatures of the precursors or adjusting the times for feeding the first to third precursors or the amount of carrier gas in a state where the vapor pressures and the temperatures are fixed. Since the precursors are fed in a gas state, it is possible to improve the step-coverage.

When plasma is applied to chamber while the reaction gas is fed, it is possible to increase a deposition rate by the activation of the reaction gas.

What is claimed is:

1. A method of depositing a Ge—Sb—Te thin film, comprising:
    a Ge—Sb—Te thin-film forming step of feeding and purging a first precursor including any one of Ge, Sb and Te, a second precursor including another one of Ge, Sb and Te and a third precursor including the other one of Ge, Sb and Te into and from a chamber in which a wafer is mounted and forming the Ge—Sb—Te thin film on the wafer; and
    a reaction gas feeding step of feeding reaction gas while any one of the first to third precursors is fed and purged, wherein the reaction gas comprises $NH_3$.

2. The method of claim 1, wherein plasma is applied into the chamber while the reaction gas is fed.

3. The method of claim 2, wherein the Ge—Sb—Te thin-film forming step is performed by sequentially performing a feeding step of feeding the first precursor, a purging step of purging the first precursor, a feeding step of feeding the second precursor, a purging step of purging the second precursor, a feeding step of feeding the third precursor, a purging step of purging the third precursor, a feeding step of feeding the second precursor again, and a purging step of purging the second precursor again, the first precursor includes Ge, the second precursor includes Te, and the third precursor includes Sb.

4. The method of claim 3, wherein the composition of the elements of the Ge—Sb—Te thin film can be adjusted by adjusting the vapor pressures and the temperatures of the first to third precursors or adjusting times for feeding the first to third precursors or the amount of carrier gas in a state where the vapor pressures and the temperatures are fixed.

5. The method of claim 1, wherein the Ge—Sb—Te thin-film forming step is performed by sequentially performing a feeding step of feeding the first precursor, a purging step of purging the first precursor, a feeding step of feeding the second precursor, a purging step of purging the second precursor, a feeding step of feeding the third precursor and a purging step of purging the third precursor.

6. The method of claim 5, wherein the composition of the elements of the Ge—Sb—Te thin film can be adjusted by adjusting the vapor pressures and the temperatures of the first to third precursors or adjusting times for feeding the first to third precursors or the amount of carrier gas in a state where the vapor pressures and the temperatures are fixed.

7. The method of claim 1, wherein the Ge—Sb—Te thin-film forming step is performed by sequentially performing a feeding step of simultaneously feeding the first precursor and the second precursor, a purging step of simultaneously purging the first precursor and the second precursor, a feeding step of simultaneously feeding the second precursor and the third precursor and a purging step of simultaneously purging the second precursor and the third precursor.

8. The method of claim 7, wherein the composition of the elements of the Ge—Sb—Te thin film can be adjusted by adjusting the vapor pressures and the temperatures of the first to third precursors or adjusting a time for feeding the first and second precursors and a time for feeding the second and third precursors or the amount of carrier gas in a state where the vapor pressures and the temperatures are fixed.

9. The method of claim 1, wherein the Ge—Sb—Te thin-film forming step is performed by sequentially performing a feeding step of simultaneously feeding the first to third precursors and a purging step of simultaneously purging the first to third precursors.

10. The method of claim 9, wherein the composition of the elements of the Ge—Sb—Te thin film can be adjusted by adjusting the vapor pressures and the temperatures of the first to third precursors or adjusting a time for feeding the first to third precursors or the amount of carrier gas in a state where the vapor pressures and the temperatures are fixed.

11. The method of claim 1, wherein the reaction gas further comprises inert gas.

12. The method of claim 2, wherein the reaction gas further comprises He and inert gas.

13. The method of claim 1, wherein the temperature of the wafer is in a range of 20° C. to 700° C.

14. The method of claim 1, wherein the pressure of the chamber is in a range of 0.1 Torr to 100 Torr.

15. The method of claim 2, wherein the temperature of the wafer is in a range of 20° C. to 700° C.

16. The method of claim 2, wherein the pressure of the chamber is in a range of 0.1 Torr to 100 Torr.

* * * * *